(12) United States Patent
Jürgensen et al.

(10) Patent No.: US 6,309,465 B1
(45) Date of Patent: Oct. 30, 2001

(54) CVD REACTOR

(75) Inventors: Holger Jürgensen, Rathausstrasse; Marc Deschler, Schlottfelder; Gerd Strauch, Schönauer; Markus Schumacher, Grosse Rur Strasse; Johannes Käppeler, Zeisigweg, all of (DE)

(73) Assignee: Aixtron AG. (DE)

( * ) Notice: Subject to any disclaimer, the term of this patent is extended or adjusted under 35 U.S.C. 154(b) by 0 days.

(21) Appl. No.: 09/381,208

(22) PCT Filed: Feb. 18, 1999

(86) PCT No.: PCT/DE99/00455

§ 371 Date: Nov. 18, 1999

§ 102(e) Date: Nov. 18, 1999

(87) PCT Pub. No.: WO99/42636

PCT Pub. Date: Aug. 26, 1999

(51) Int. Cl.$^7$ .................................................... C23C 16/00
(52) U.S. Cl. .................. 118/715; 118/723 R; 118/723 E
(58) Field of Search ..................... 118/715, 728, 118/723 R, 723 E; 156/345; 204/298.07, 298.33

(56) References Cited

U.S. PATENT DOCUMENTS

| | | | |
|---|---|---|---|
| 5,755,886 | * | 5/1998 | Wang et al. .......................... 118/715 |
| 5,766,364 | * | 6/1998 | Ishida et al. ......................... 118/725 |
| 6,055,927 | * | 5/2000 | Shang et al. ................... 118/723 ME |

* cited by examiner

Primary Examiner—Gregory Mills
Assistant Examiner—Luz L. Alejandro
(74) Attorney, Agent, or Firm—St. Onge Steward Johnston & Reens LLC

(57) ABSTRACT

A CVD reactor comprising: a reactor casing with a casing cover, a heated susceptor for one wafer or several wafers, which is disposed in the reactor casing, a fluid inlet unit including a plurality of openings facing said wafer or wafers through which the CVD media, which is moderately heated, enter the reactor, and a fluid outlet disposed on the periphery of the reactor casing, through which the introduced media is discharged; wherein the fluid outlet has roughly the shape of a disk with a plurality of outlet openings for the discharge of CVD media, and is disposed between the susceptor and the reactor cover in such a way that the fluid outlet is heated by the susceptor by radiation and hence adjusts itself to a temperature between the temperature of the susceptor and the reactor cover through which the CVD media enter in a moderately heated state.

32 Claims, 1 Drawing Sheet

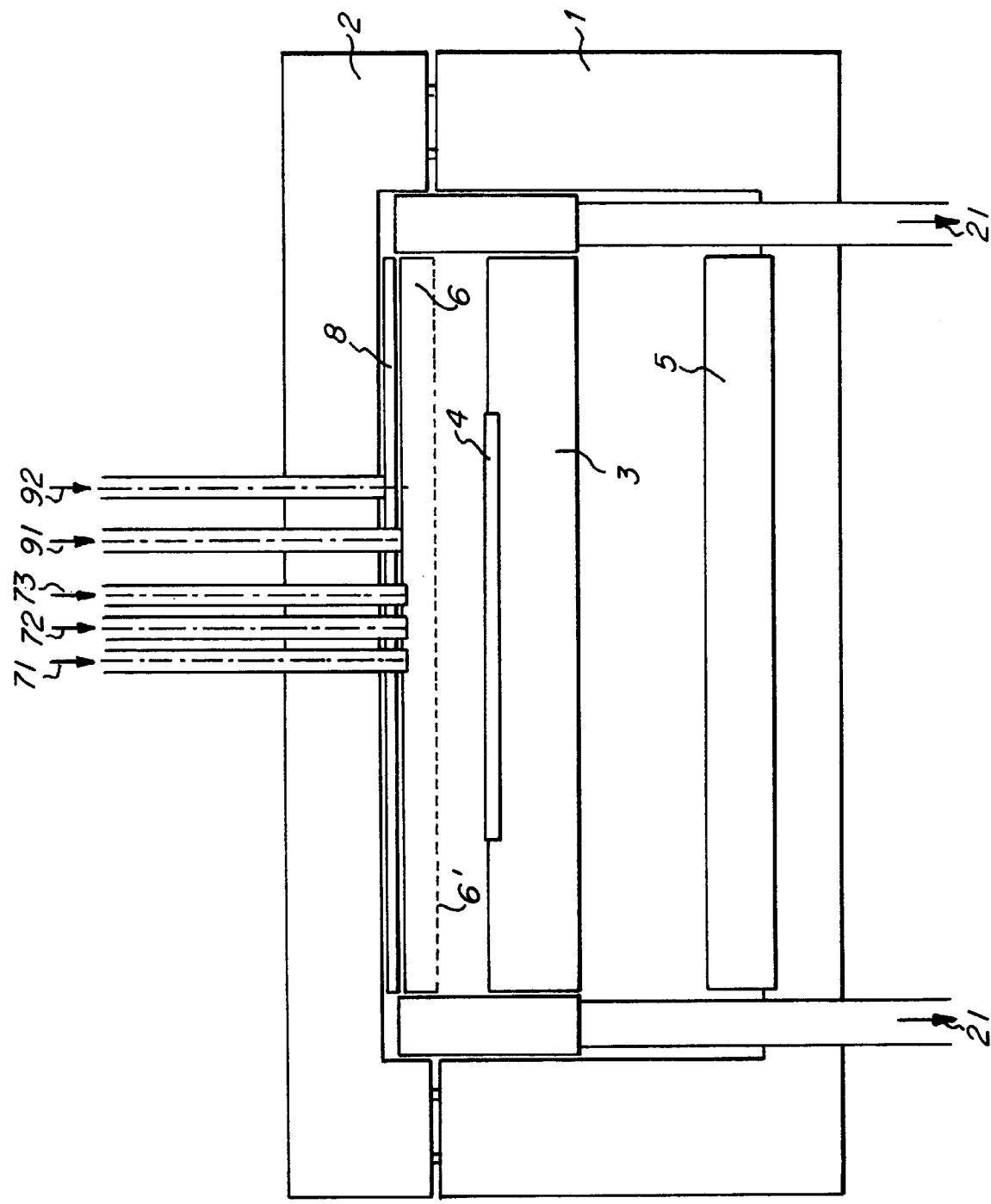

CVD REACTOR

DESCRIPTION

1. Field of the Invention

The present invention relates to a CVD reactor in accordance with the introductory clause the Patent Claim 1, as well as to its application.

2. Prior Art

CVD reactors are generally common and are manufactured and distributed by companies such as Aixtron AG, Aachen, Germany. For an explanation of all terms which are not described here in more details explicit reference is made to these known CVD reactors.

The known CVD reactors comprise a reactor casing with a cover, in which a heated susceptor (wafer carrier) is provided on which at least one wafer can be positioned. A central fluid inlet is provided as a rule for the supply of CVD gases or liquids. The fluid outlet is then arranged mostly on the periphery of the reactor casing.

Either central gas inlet nozzles, which permit the radial outflow of the gases from the centre of the reactor via the wafers, or so-called shower heads are used in or on the reactor cover, which are disposed directly above the wafer and spray the gas in the form of a shower through a great number of small holes in a vertical downward direction onto the wafers. Such reactors are distributed, for instance, by the company of Thomas Swan, GB.

The German Patent DE 43 30 266 discloses a similar structure, wherein a single-wafer reaction chamber includes a wafer heating stage for holding a wafer down and for heating the wafer. Moreover, a gas supply head including gas inlet nozzles is located opposite to the wafer heating stage so that a zone of constant spacing is created for the supply of reaction gas. Gases are then allowed to flow out via the gas supply head. An exhaust gas outlet is equally provided.

There are now materials for which it is expedient if the gases are introduced into the reactor in a slightly heated state. This can be achieved with the provision that the gases are pre-heated or that the inlet is heated.

For fluid inlets configured as shower heads it is common to equip the shower head with complex water passages for thermostat-controlled heating. This configuration entails not only the disadvantage that it is complicated and hence expensive but also the inexpediency that the use of water passages in CVD reactors always involves a certain risk. For instance in the event of a leakage the cooling water may leak into the interior of the reactor and undergo an explosion-type reaction with the CVD gas or gases there. Another disadvantage is the unevenness in terms of temperature in the shower head, which is linked up with the heating of the water.

In accordance with the German Patent DE 43 30 266 the gas is passed through a gas supply head and its gas inlet nozzles in the zone of constant spacing via a wafer. Here, too, a cooling-water path and a heat-maintaining element takes an influence on the temperature in the inlet zone. There, the temperature of the inner wall of a space element adjacent to the gas inlet zones is held at a constant temperature level. In this case the aforementioned disadvantages involved in water passages apply as well.

BRIEF DESCRIPTION OF THE INVENTION

The present invention is based on the problem of improving a CVD reactor comprising a fluid inlet configured as shower head or gas inlet nozzles in such a way that the fluid inlet and hence the fluids to be introduced, i.e. gases and/or liquids, can be moderately heated in a simple manner and particularly with water passages etc. being dispensed with.

One inventive solution to this problem is defined in Patent Claim 1. Improvements of the invention are the subject matters of Claims 2 et seq. In Claims 31 and 32 methods using a reactor defined in accordance with the invention are claimed.

According to the present invention, a CVD reactor presenting the features defined in the introductory clause of Patent Claim 1 is improved in such a way that the fluid inlet unit comprises a hollow body spaced from the reactor cover, with the underside of the hollow body, in which the openings are provided, being heated substantially by thermal radiation from the susceptor (wafer carrier), that a flushing gas inlet device is provided which introduces a flushing gas into the space between the upper side of the hollow body and the reactor cover in such a way that the upper side radiates heat substantially by thermal convection in the gas to the environment, and that the conditions of heat supply and dissipation to or from the hollow body are so adjusted that the underside adapts itself to a selectable temperature level without the supply of a moderately heating medium from the outside; and that a positive gradient is present between the upper side and the underside of the hollow body.

For the purpose of the present description the term "CVD media" is to be understood to denote CVD and particularly MOCVD gases, liquids, solutions or mixture of the aforementioned substances—which will also be generally referred to in the following by the general term "fluid".

In accordance with the present invention a known CVD reactor is hence improved by the provision that the fluid inlet unit comprises a unit which has roughly the shape of a hollow disk with a plurality of outlet openings for the CVD media, etc.—i.e. of a shower head known per se—and is disposed between the susceptor (wafer carrier) and the reactor cover in such a way that the underside of the fluid inlet unit is heated by radiation from the susceptor (wafer carrier) and is hence adjusted to be a temperature between the temperature of the susceptor (wafer carrier) and the reactor cover so that the CVD media etc. will be moderately heated when they pass through the fluid inlet unit. As an (adjustable) heat sink is provided on the upper side of the fluid inlet unit a defined temperature gradient is created in the axial direction via the fluid inlet unit.

The invention starts out from the fundamental idea to simplify the complex structure of known reactors in which the adjustment of the reactor cover and of the gas inlet in the form of a shower head through which a liquid passes and of separate heating systems required to this end is performed under thermostat control, by the provision that the shower head is configured as a component separate from the reactor cover. As the susceptor (wafer carrier) is heated any how by an infrared heating, a resistance heating or a high-frequency heating to a temperature level between roughly RT° C. and 1200° C. in a typical case (RT denotes room temperature) and hence radiates a substantial heat quantity to its environment by radiation, the fluid inlet unit is heated. On account of the inventive provisions the temperature to which the fluid inlet unit is heated is set in a controlled manner.

It is preferred to arrange a thin shower head made of a metal having good heat conduction properties in the reactor below the reactor cover and possibly underneath a ceiling under the thermostat control.

This structure presents a number of advantages:

The shower head is heated directly by the radiation from below from the susceptor (wafer carrier). In particular, the spacing between the susceptor (wafer carrier) and the hollow body may be adjustable for setting the temperature of the underside of the hollow body. To this end a holding unit may be provided for the hollow body with a thread.

The heat supply or dissipation to or from the hollow body is determined by the temperature of the susceptor (wafer carrier), by the spacing from the susceptor (wafer carrier) which can now be freely adjusted, and by the conductivity of the gas in the reactor (selection of the carrier gas, e.g. nitrogen or hydrogen or a mixture of these gases and total pressure). The availability of an additional heating system, which has so far been necessary for heating and moderate heating of the shower head, is hence no longer required.

The heat dissipation from the upper side of the shower heat in an upward direction is determined by the particular flushing gas which is used above the shower head and the quartz ceiling, and by the particular flushing gas used between the quartz ceiling and the cover of the metal reactor.

Here the thermostatically controlled ceiling proposed by Frijlink et al. may be employed in particular. Insofar the application of two flushing gas mixtures permits a highly precise control or setting of the absolute temperature and of the temperature gradient of the shower head in the reactor.

Above all, the positive temperature gradient from the shower head to the susceptor (wafer carrier), which is desirable in the majority of applications, is automatically ensured. The temperature gradient may be additionally influenced in a controlled manner by means of a further embodiment providing for the introduction of local metal sheets serving as thermal shields and a multi-layer configuration of the shower head with materials presenting different coefficients of reflection and absorption.

In all other respects, the reactor presents a conventional structure: in particular, the reactor may be a round reactor— resembling the known planetary reactor—with a central gas inlet and a gas outlet (exhaust) surrounding it on the outside. The gas outlet (exhaust) may be the tunnel, in particular, which has been proposed by Frijlink et al. The ceiling of the reactor may equally be configured in the form proposed by Frijlink and is hence adapted for thermostatic control.

The susceptor (wafer carrier) is either a planetary susceptor (planetary wafer carrier) with dual rotation or only a large plain disk which, however, operates also on gas foil rotation (i.e. rotation of the wafers on a gas cushion; patent held by the Applicant, the company of Aixtron) or which is mechanically rotated. In the latter case, one wafer can be centrally positioned for each process only but this wafer may have major dimensions. In an alternative or additionally it is possible to rotate the fluid inlet device about its axial axis.

For the production of layers of multi-component material systems, for instance, β-diketonates or other metal-organic solutions are used which may be mixed, on the one hand, in the shower head directly by the structural provision of one or several inlets into the shower head, at the same temperature or at different temperature levels. On the other hand, the shower head may also by configured in such a way that different gases are separately passed in the shower head and that they are thoroughly mixed only when they leave the shower head into the reactor space so as to avoid parasitic pre-reactions.

The risk of using additional cooling water in the vicinity of the gas inlet for thermostat control does not occur. The shower head is substantially easier to adjust and exchange. The reactor becomes highly flexible because the most different shower heads can be mounted and exchanged very quickly for adjustment to different wafer sizes, without any major modifications of the reactor, dismantling or opening of medium-carrying lines. The reactor is thermally defined on all sides and all the walls are heated so that a minimum of accumulations will be created.

Another advantage resides in the aspect that each planetary reactor already available is very easy to retrofit because the fluid inlet unit is fully compatible with conventional inlets.

The inventive reactor may be used for CVD processes of any kind, hence, for instance, for the application or processing of III-V, II-VI, IV-IV materials, moreover of single-component or multi-component oxides, perovskites such as barium and strontium titanate (ST or BT, respectively), barium strontium titanate (BST), strontium and barium zirconate titanates, strontium bismuth tantalate (SBT), lead circonate titanate (PZT) as well as the aforementioned material systems doped with an acceptor or/and a donator.

Another advantage resides in the fact that the shower heads are very easy to exchange. In dependence on the respective wafer shape used, it is thus possible to use shower heads having an arrangement of holes or outlets in correspondence with the arrangement and the shape of the wafers disposed therebeneath so that a highly homogeneous and yet economical processing or coating of the wafers will be possible.

Moreover, the reactor presenting the inventive design may also be operated with etching or cleansing fluids so as to remove possibly created accumulations or condensates as rapidly as possible (self cleaning). With this design the reactor is equipped with a shower head made of a material resistant to the etching gas.

Furthermore, the reactor may be operated on a normal gas supply system or even with a source distribution system (liquid delivery system) or an aerosol system which supplies the gases in a moderately heated state already (so-called LDS system).

In the event of dual rotation (planetary rotation) the rotational speed is comparatively low and ranges between 10 and 200 revolutions per minute (rpm) in typical cases.

If only a single wafer is centrally positioned the most different rotational speeds may be used in the range from 5 to 1500 revolutions per minute (rpm).

BRIEF DESCRIPTION OF THE DRAWING

The invention will be described in the following by exemplary embodiments, without any restriction of the general inventive idea, with reference to the drawing wherein the single FIGURE shows a schematic cross-sectional view taken through an inventive device.

DESCRIPTION OF THE PREFERRED EMBODIMENTS

The CVD reactor illustrated in the cross-sectional view in the FIGURE comprises a reactor vessel 1 with reactor cover 2. In the illustrated embodiment the reactor vessel 1 and the cover 2 are water-cooled so that they are permanently maintained approximately at room temperature. In the reactor vessel 1, which may have a cylindrical shape in particular, a gas outlet 21 is provided in a manner known per se.

In the interior of the reactor vessel 1 moreover a susceptor (wafer carrier) 3 for wafers 4 is disposed which are to be processed or coated, respectively, by means of a CVD process. The susceptor (wafer carrier) 3 is heated to a temperature between roughly RT° C. and 1200° C. (RT means room temperature) by means of a heating means 5 which may be of the infrared, the resistance or the high-frequency type.

A fluid inlet unit 6 is disposed above the susceptor (wafer carrier) 3 which, in the embodiment illustrated here, has the shape of a hollow disk. A plurality of holes (schematically indicated in the FIGURE) is provided in the underside 6' of the unit 6 in an arrangement which may be matched with the shape of the wafer 4. The spacing between the fluid inlet unit 6 and the susceptor (wafer carrier) 3 may be adjusted by means such as a threading.

Lines 71 and 73 open into the interior space of the hollow disk 6, through which the gases and particularly CVD gases flow from a gas supply unit—which is not illustrated here but is known per se in all respects and which includes a means for moderate pre-heating if necessary—into the interior space of the hollow disk 6. The gases then leave the interior space through the holes (not illustrated here) and produce a homogeneous action upon the wafers 4.

A thermal shield 8, which is also referred to as ceiling, is provided between the hollow disk 6 and the underside of the reactor cover 2. The thermal shield 8 is a plate made of a thermally resistant and inert material; in the embodiment illustrated here the plate is made of quartz.

Moreover, a flushing gas inlet means is provided which is connected to the reactor via lines 91 and 92. The line 91 opens into the space between the thermal shield 8 and the upper side of the hollow disk 6 whereas the line 92 opens into the space between the reactor cover 2 and the thermal shield 8. The flushing gas inlet means is so configured that the composition and/or the flow rate of the gases introduced into the space or spaces above the upper side of the hollow body may be varied for setting the conditions of heat dissipation.

The conditions of heat supply and dissipation to or from the hollow body 6 may be so controlled that the lower side adjusts itself to a selectable temperature, by which the CVD media undergo a moderate heating, without the supply of a medium for moderate heating from the outside, and that a positive temperature gradient will occur between the upper side and the underside of the hollow body. With these provisions clogging of the holes is avoided. Moreover, a positive temperature gradient towards the susceptor (wafer carrier) prevails.

What is claimed is:

1. CVD reactor comprising:
   a reactor casing with a casing cover,
   a heated susceptor for one wafer or several wafers, which is disposed in the reactor casing,
   a fluid inlet unit including a plurality of openings facing said wafer or wafers through which heated CVD media enter the reactor, and
   a fluid outlet disposed on the periphery of the reactor casing, through which the introduced media are discharged again,
   the reactor characterized in that:
      said fluid inlet unit comprises a hollow body spaced from said casing cover having an underside, in which said openings are provided, which is heated by said susceptor substantially by thermal radiation and/or thermal conduction,
      a flushing gas inlet means is provided which introduces a flushing gas into a space between an upper side of said hollow body and said casing cover in such a way that the upper side will dissipate heat into an environment outside the CVD reactor through the flushing gas, and
      that conditions of heat supply and dissipation to or from said hollow body, respectively, are so controlled as to heat said CVD media, without any supply of a medium for heating from outside of a gas supply system of the CVD reactor, and that a positive temperature gradient exists between the upper side and the underside of said hollow body.

2. The reactor according to claim 1, characterized in that a spacing between said susceptor and said hollow body is adapted to be adjustable for setting a temperature of the underside of said hollow body.

3. The reactor according to claim 2, characterized in that a holding unit for said hollow body with a threading is provided for setting said spacing between said susceptor and said hollow body.

4. The reactor according to claim 1, characterized in that said casing cover is thermostatically controlled.

5. The reactor according to claim 4, characterized in that said casing cover presents provisions for cooling by means of a liquid medium such as water.

6. The reactor according to claim 1, characterized in that a thermal shield is provided between said casing cover and the upper side of said hollow body.

7. The reactor according to claim 6, characterized in that said thermal shield is a plate made of a thermally resistant and inert material such as quartz.

8. The reactor according to claim 6, characterized in that said flushing gas inlet device introduces different gases or gas compositions, respectively, between the upper side of said hollow body and said thermal shield and between said thermal shield and said casing cover.

9. The reactor according to claim 6, characterized in that in addition to said thermal shield further thermal shields are provided between the upper side of said hollow body and said casing cover.

10. The reactor according to claim 1, characterized in that said flushing gas inlet device comprises a first gas outlet in a space between the casing cover and a thermal shield, and a second gas outlet in a space between said thermal shield and the upper side of said hollow body.

11. The reactor according to claim 1, characterized in that said flushing gas inlet device is so configured that a composition and/or a flow rate of the gas or gases introduced into a space or spaces above the upper side of said hollow body may be varied for setting conditions of heat dissipation.

12. The reactor according to claim 11, characterized in that said flushing gas inlet device introduces a gas mixture composed of gases displaying a different thermal conduction, such as a mixture of $H_2$ and $N_2$.

13. The reactor according to claim 1, characterized in that said hollow body consists of a metal having a thermal conductivity or of several layers of different metals having different coefficients of thermal conductivity, reflection and absorption properties.

14. The reactor according to claim 13, characterized in that said hollow body has a low thermal capacity.

15. The reactor according to claim 13, characterized in that said hollow body is a thin disk.

16. The reactor according to claim 1, characterized in that said susceptor is a planetary susceptor with dual rotation.

17. The reactor according to claim 1, characterized in that said susceptor is a disk.

18. The reactor according to claim 17, characterized in that said disk rotates mechanically or operates on gas foil rotation.

19. The reactor according to claim 17, characterized in that said hollow body or parts of said hollow body is or are designed for rotation, and that said disk and/or said susceptor is not rotated.

20. The reactor according to claim 1, characterized in that said fluid inlet unit is so designed that gases and/or liquids such as metal-organic solutions in particular may be mixed in said hollow body.

21. The reactor according to claim 1, characterized in that said fluid inlet unit is so configured that it includes separate openings for different fluids.

22. The reactor according to claim 21, characterized in that the separate openings are so arranged that the fluids will be mixed with each other upon their discharge from said openings.

23. The reactor according to claim 1, characterized in that an additional means for heating is provided which heats said CVD media prior to their entry into said hollow body.

24. The reactor according to claim 1, characterized in that said fluid inlet unit is so designed that it will be resistant to an etching or cleansing gas.

25. The reactor according to claim 1, characterized in that the reactor has a shape of a circular cylinder.

26. The reactor according to claim 1, characterized in that side walls of the reactor are thermostatically controlled.

27. The reactor according to claim 1, characterized in that pressure inside the reactor amounts to an approximate value between 0.1 and 1000 mbar.

28. The reactor according to claim 1, characterized in that said fluid inlet unit supplies said CVD media at pressure levels between 0.1 mbar and 10 bar.

29. The reactor according to claim 1, characterized in that an infrared heating means, a resistance heating means or a high-frequency heating means heats said susceptor.

30. The reactor according to claim 29, characterized in that said heating means heats said susceptor to approximately a temperature between room temperature and 1200° C.

31. The reactor according to claim 1 for the production of thin layers of III-V, II-VI, IV-IV materials, moreover of single-component and multi-component oxides, perovskites, particularly barium and strontium titanate, barium strontium titanate, strontium and barium zirconate titanate, strontium bismuth tantalate, lead zirconate titanate.

32. The reactor according to claim 31 for the production of thin doped layers and particularly layers doped with an acceptor or a donator.

* * * * *